United States Patent
Saviers et al.

(10) Patent No.: US 11,583,929 B2
(45) Date of Patent: Feb. 21, 2023

(54) COLD PLATE DESIGN FEATURES AMENABLE FOR ADDITIVE MANUFACTURING POWDER REMOVAL

(71) Applicant: Raytheon Company, Waltham, MA (US)

(72) Inventors: Kimberly Saviers, Glastonbury, CT (US); John Whiton, South Windsor, CT (US); Neal Herring, East Hampton, CT (US)

(73) Assignee: Raytheon Company, Waltham, MA (US)

(*) Notice: Subject to any disclaimer, the term of this patent is extended or adjusted under 35 U.S.C. 154(b) by 112 days.

(21) Appl. No.: 17/175,091

(22) Filed: Feb. 12, 2021

(65) Prior Publication Data

US 2022/0258241 A1    Aug. 18, 2022

(51) Int. Cl.
| | |
|---|---|
| *B22F 10/28* | (2021.01) |
| *B33Y 10/00* | (2015.01) |
| *B33Y 80/00* | (2015.01) |
| *B29C 64/153* | (2017.01) |
| *B29C 64/35* | (2017.01) |
| *B33Y 40/20* | (2020.01) |
| *B22F 10/68* | (2021.01) |

(52) U.S. Cl.
CPC ............. *B22F 10/28* (2021.01); *B22F 10/68* (2021.01); *B29C 64/153* (2017.08); *B29C 64/35* (2017.08); *B33Y 10/00* (2014.12); *B33Y 40/20* (2020.01); *B33Y 80/00* (2014.12)

(58) Field of Classification Search
CPC ...... B22F 10/28; B22F 10/68; B22F 2999/00; B22F 5/10; B29C 64/153; B29C 64/35; B33Y 10/00; B33Y 40/20; B33Y 80/00; F28F 3/12; F28F 7/02; B08B 7/02; F28D 2021/0029; Y02P 10/25; H05K 7/20254
See application file for complete search history.

(56) References Cited

U.S. PATENT DOCUMENTS

| | | | |
|---|---|---|---|
| 6,688,381 B2 | 2/2004 | Pence et al. | |
| 9,953,899 B2* | 4/2018 | Chen | H05K 7/20281 |
| 10,105,671 B2* | 10/2018 | Aimone | B01J 19/2415 |
| 10,583,606 B2 | 3/2020 | Joerger et al. | |
| 10,634,440 B2* | 4/2020 | Phillips | B33Y 40/00 |

(Continued)

OTHER PUBLICATIONS

Invitation to Pay Additional Fees and, Where Applicable, Protest Fee from PCT Application No. PCT/US2021/061452, dated Mar. 3, 2022, 16 pages.

(Continued)

*Primary Examiner* — Lawrence Averick
(74) *Attorney, Agent, or Firm* — Kinney & Lange, P.A.

(57) ABSTRACT

A method of manufacturing a cold plate includes forming a fluid circuit on a build surface in a layer-by-layer fashion from a build material. The fluid circuit includes a plurality of peripheral walls, each of the plurality of peripheral walls at least partially defining a primary channel, a longitudinally one of the peripheral walls being formed to include apertures configured to permit excess build material to pass therethrough. A central wall of the fluid circuit at least partially defines the primary channel and a plurality of secondary channels fluidly connected to the primary channel. The method further includes removing excess build material through the apertures.

15 Claims, 5 Drawing Sheets

(56) References Cited

U.S. PATENT DOCUMENTS

| | | | | |
|---|---|---|---|---|
| 11,204,205 | B2* | 12/2021 | Coddé | H01L 23/473 |
| 2012/0006383 | A1* | 1/2012 | Donnelly | H02S 40/44 |
| | | | | 136/246 |
| 2012/0285660 | A1 | 11/2012 | Poltorak | |
| 2015/0121701 | A1 | 5/2015 | Loong et al. | |
| 2016/0129417 | A1* | 5/2016 | Aimone | B01J 19/02 |
| | | | | 422/240 |
| 2017/0064868 | A1 | 3/2017 | Rush et al. | |
| 2017/0092565 | A1* | 3/2017 | Chen | H01L 21/4882 |
| 2017/0363377 | A1* | 12/2017 | Phillips | B22F 10/31 |
| 2021/0156627 | A1* | 5/2021 | Coddé | F28F 3/12 |
| 2021/0231382 | A1* | 7/2021 | Steinbauer | F28D 9/0062 |

OTHER PUBLICATIONS

R. Neugebauer, et al., "Additive Manufacturing Boosts Efficiency of Heat Transfer Components", from Assembly Automation, vol. 31, No. 4, 2011, pp. 344-347.

X. Guo, et al., "Multi-channel Heat Exchanger-Reactor Using Arborescent Distributors: A Characterization Study of Fluid Distribution, Heat Exchange Performance and Exothermic Reaction", from Energy 69, 2014, pp. 728-741.

S. A. Niknam, et al., "Additively Manufactured Heat Exchangers: A Review on Opportunities and Challenges", from The Int'l. Journal of Advanced Mfg. Tech., 2021, pp. 601-618.

International Search Report and Written Opinion from PCT Application Serial No. PCT/US2021/061452, dated Apr. 25, 2022, 19 pages.

* cited by examiner

COLD PLATE DESIGN FEATURES AMENABLE FOR ADDITIVE MANUFACTURING POWDER REMOVAL

BACKGROUND

The present disclosure relates generally to cold plates, and more particularly, to methods of designing and manufacturing a cold plate fluid circuit with branching channels.

Many thermal management systems use cold plates to cool heat-generating electronics. Most cold plates are designed to pass a single fluid across the plate to absorb waste heat from associated electronics. Various standard designs include u-turns or other circuitous internal fluid channels that may also include fins. Current design processes and manufacturing methods limit the complexity of cold plate designs, thus limiting thermal transfer capabilities. New design methods are desirable for improving thermal transfer and flow performance across the cold plate.

SUMMARY

A method of manufacturing a cold plate includes forming a fluid circuit on a build surface in a layer-by-layer fashion from a build material. The fluid circuit includes a plurality of peripheral walls, each of the plurality of peripheral walls at least partially defining a primary channel, a longitudinally one of the peripheral walls being formed to include apertures configured to permit excess build material to pass therethrough. A central wall of the fluid circuit at least partially defines the primary channel and a plurality of secondary channels fluidly connected to the primary channel. The method further includes removing excess build material through the apertures.

A method of designing a fluid circuit for a cold plate includes performing operations on a three-dimensional model of the cold plate based upon input parameters, the optimization operations including identifying solid regions of the fluid circuit with a first numeric value, identifying open regions of the fluid circuit with a second numeric value, and identifying intermediate regions of the fluid circuit with at least one numeric value between the first and second numeric value. The method further includes generating an optimized model and translating the optimized model such that the intermediate regions represent partially-open regions.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

This disclosure presents methods for designing and manufacturing a cold plate fluid circuit having complex geometry. The fluid circuit can have a primary channel, secondary channels branching from the primary channel, and tertiary channels branching from the secondary channels. Such a design can be manufactured using a powder-based additive manufacturing technique. An intermediate cold plate structure can include apertures for evacuating excess powder. The design process for the fluid circuit can include topology optimization to generate the channel layout which can be translated to a production model for additive manufacturing.

Figure 1:
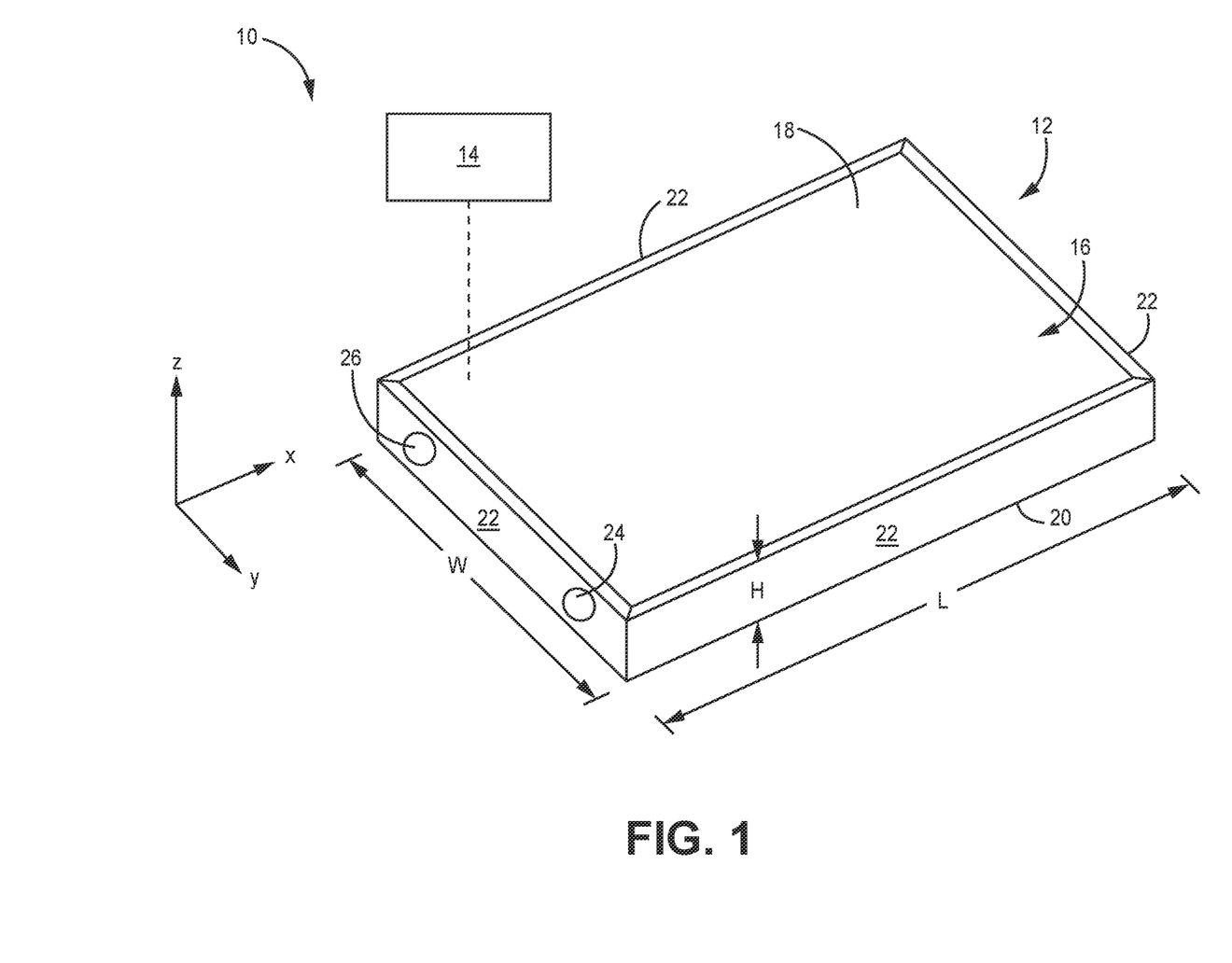
FIG. 1 is a perspective view of a cold plate assembly.

FIG. 1 is a simplified perspective view of cold plate assembly 10 including cold plate 12 and at least one heat-generating component 14 in thermal communication with cold plate 12. Although represented schematically, heat-generating component 14 can be an electronic component in physical contact with cold plate 12 such as removably mounted to cold plate 12 as is discussed in greater detail below.

Cold plate 12 includes outer housing 16 which includes cover plate 18, an oppositely disposed base plate 20, and four side walls 22. Outer housing 16 can be formed from a metal or non-metal material suitable for thermal management applications. Fluid inlet 24 and fluid outlet 26 are disposed in a widthwise sidewall 22, as shown in FIG. 1. Fluid inlet 24 can be a port or other opening in communication with a source of cooling fluid F for receiving cooling fluid F (labeled in FIG. 2), while fluid outlet 26 can be a port or other opening for exhausting used cooling fluid F. In the embodiment shown, fluid inlet 24 and fluid outlet 26 are disposed in the same sidewall 22, however in alternative embodiments, fluid inlet 24 can be disposed in a first sidewall 22, while fluid outlet 26 can be disposed elsewhere, such as in an adjacent or oppositely disposed sidewall 22.

In the embodiment of FIG. 1, outer housing 16 gives cold plate 12 a generally rectangular, three-dimensional structure having a length L along the x-axis, a width W along the y-axis, and a height H along the z-axis. As shown, the dimensions of cold plate 12 are such that L> W>H, although other dimensions are contemplated herein based on, for example, spatial constraints and/or thermal transfer requirements. As such, cold plate 12 can have other polygonal geometries, such as a square (L=W>H) or cube (L=W=H). In an alternative embodiment, cold plate 12 can have one or more curved sides to form a rounded shape, a shape having curved and straight sides, or a more freeform shape.

Figure 2:
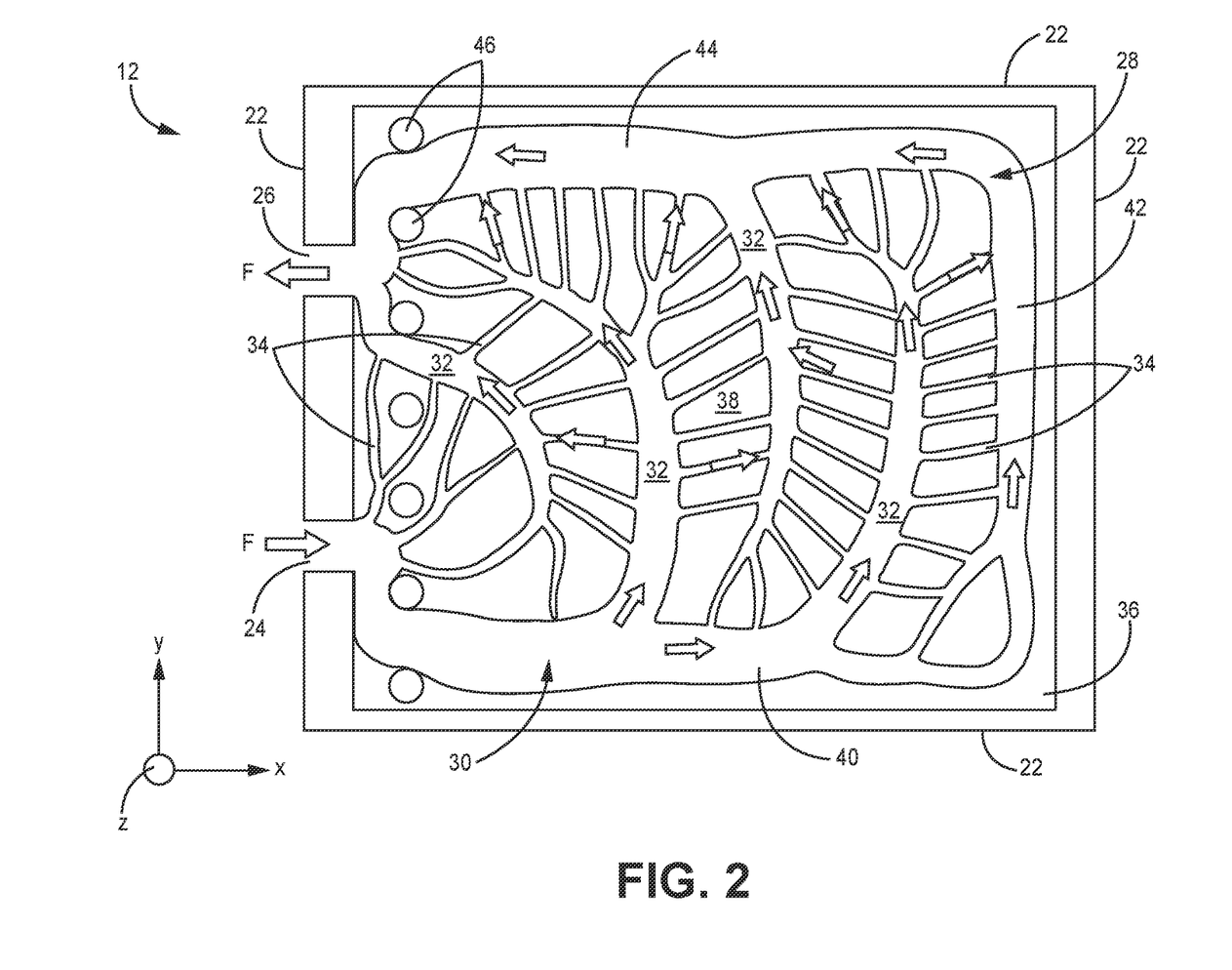
FIG. 2 is a top plan view of the cold plate assembly with the cover plate removed to illustrate a fluid circuit disposed through the cold plate.

FIG. 2 is a top plan view of cold plate 12 shown without cover plate 18 to expose fluid circuit 28 disposed within an interior space defined by outer housing 16. Fluid circuit 28 of cold plate 12 includes primary channel 30, secondary channels 32, and tertiary channels 34. Peripheral wall 36 and center wall 38 together at least partially define primary channel 30, secondary channels 32, and tertiary channels 34. More specifically, walls 36 and 38 can be formed from a solid metal or non-metal material extending variably along the x, y, and z-axes to define the various channels. In certain embodiments, peripheral wall 36 and/or center wall 38 can be formed as a generally continuous, single wall structure, or as discrete wall segments grouped in such a way as to form a wall structure.

In the embodiment shown in FIG. 2, primary channel 30 has a generally u-shaped geometry to fluidly connect fluid inlet 24 and fluid outlet 26 disposed in the same sidewall 22. As such, u-shaped primary channel 30 includes inlet leg 40, the section of primary channel 30 immediately downstream of inlet 24 and disposed generally along the x-axis. Connecting portion 42 of primary channel 30 is disposed generally along the y-axis and fluidly connects inlet leg 40 to outlet leg 44. Outlet leg 44 is immediately upstream of fluid outlet 26 and is generally parallel to inlet leg 40.

Secondary channels 32 branch from primary channel 30. In the embodiment shown in FIG. 2, secondary channels 32 have a somewhat curved geometry but branch generally perpendicularly (with some segments disposed along the y-axis) from each of inlet leg 40 and outlet leg 44 and have an interdigitated configuration due to the meandering/winding geometry of center wall 38. An alternative embodiment could additionally/alternatively include secondary channel (s) 32 branching from connecting portion 42.

Tertiary channels 34 branch from secondary channels 32 and are disposed within the solid material of center wall 38. Tertiary channels 34 branch in various directions such that some tertiary channels 34 can be disposed generally along the x-axis, some other tertiary channels 34 can be disposed generally along the y-axis, and yet other tertiary channels can be disposed in an angled fashion between the x and y-axes. The disposition of tertiary channels 34 allows for the fluid interconnection of primary and secondary channels, as is discussed in greater detail below.

In an alternative embodiment, fluid circuit 28 can include further branching stages beyond tertiary channels (e.g., quinary, senary, septenary, etc.) based on thermal transfer requirements and/or design parameters. Another alternative embodiment can include a primary channel and only secondary channels directly fluidly connecting various sections (e.g., inlet leg and outlet leg) of the primary channel. Generally, the final ($n^{th}$) branching stage in any embodiment will fluidly connect earlier stages of the fluid circuit across the plane of the fluid circuit.

One or more holes 46 can also be formed through the solid material of walls 36 and/or 38 as well as a portion of outer housing 16 (e.g., base plate 20). Holes 46 are configured to accommodate fasteners (not shown) for removably attaching cold plate 12 to another structure such as heat-generating component 14 or a mount.

Figure 3:
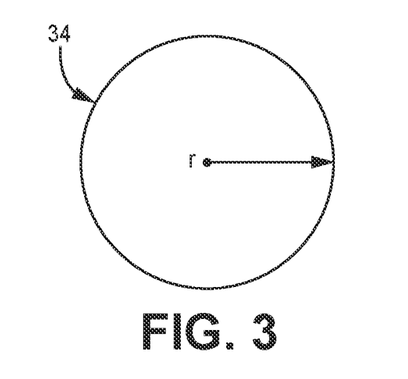
FIG. 3 is a simplified cross-sectional view of a tertiary channel of the fluid circuit.

Primary channel 30, secondary channels 32 and tertiary channels 34 can have a cross-sectional area A. Cross-sectional area can be determined by the cross-sectional geometry of a channel, for example, $A=\pi r^2$ for a circular cross-sectional shape (as shown in FIG. 3), and $A=\pi r_1 r_2$ for an elliptical shape, where $r_1$ and $r_2$ represent major and minor axes, respectively. For quadrilateral cross-sectional geometries, $A=LW$, where L is length and W is width. Other, more irregular geometries including curved and/or straight sections are contemplated herein. The cross-sectional shape and/or area of any of primary channel 30, secondary channels 32, and/or tertiary channels 34 can vary along the individual channel length based on flow requirements and/or design optimization.

Generally, an average cross-sectional area of primary channel 30 is greater than an average cross-sectional area of a secondary channel 32, and an average cross-sectional area of a secondary channel 32 is greater than an average cross-sectional area of a tertiary channel 34. Additionally, and as can be seen in FIG. 2, the number of secondary channels 32 is greater than the number of primary channels (one), and the number of tertiary channels 34 is greater than the number of secondary channels 32.

FIG. 2 includes arrows to indicate the flow pattern of cooling fluid F through fluid circuit 28. It should be understood, however, that not all possible flow paths are marked by arrows. Cooling fluid F can be water, air, oil, ethylene glycol, or a refrigerant, to name a few, non-limiting examples. Any of the cooling fluids, such as refrigerants, can further be two-phase (e.g., vapor-liquid) fluids.

In operation, cooling fluid F enters fluid circuit 28 via fluid inlet 24 and travels in a first direction along inlet leg 40 of primary channel 30. A portion of the cooling fluid enters secondary channels 32 branching from inlet leg 40 (inlet-side secondary channels 32), while another portion of the cooling fluid remains in primary channel 30, continuing along connecting portion 42 and outlet leg 44. Cooling fluid flows along outlet leg in the opposite direction of cooling fluid within inlet leg 40. Cooling fluid entering inlet-side secondary channels 32 flows through branching tertiary channels 34 formed in portions of center wall 38 defining the particular secondary channel 32. As can be seen in FIG. 2, a subset of tertiary channels 34 fluidly connects an inlet-side secondary channel 32 to outlet leg 44. Another subset of tertiary channels 34 fluidly connects an inlet-side secondary channel 32 to a secondary channel 32 branching from outlet leg 44 (outlet-side secondary channel 32). Yet another subset of tertiary channels 34 fluidly connects inlet-side secondary channels 32 to connecting portion 42. Finally, yet another subset of tertiary channels 34 branch directly from inlet leg 40 and extend to an outlet-side secondary channel 32 to fluidly connect inlet leg 40 and the outlet-side secondary channel 32. Used cooling fluid F is exhausted from fluid circuit 28 via fluid outlet 26. Used cooling fluid generally has a temperature higher than the temperature of cooling fluid F at fluid inlet 24 due to absorption of waste heat from heat-generating component 14. The branching design and interconnection of channels within fluid circuit 28 allows for more even distribution of fluid flow and thermal transfer across cold plate 12, because cooling fluid F can flow generally simultaneously across the plane of fluid circuit 28 defined by the x and y-axes using the primary, secondary, and tertiary channels.

In an alternative embodiment, fluid circuit 28 can alternatively or additionally be configured to receive a warm fluid and reject heat from the fluid to an associated component requiring heating instead of cooling. In such an embodiment, the fluid exhausted from the fluid circuit would generally have a lower temperature than the fluid entering the fluid circuit. Receiving a relatively hot fluid can be useful, for example, during or after a cold soak condition of the system, vehicle, etc., or generally to improve overall performance of associated electronics.

In the embodiment shown in FIG. 2, fluid inlet 24 and fluid outlet 26 are both disposed in a common sidewall 22, however, other arrangements are possible. For example, fluid outlet 26 can be disposed within an adjacent or opposing sidewall 22 in an alternative embodiment. Another alternative embodiment can include multiple fluid inlets 24 and/or multiple fluid outlets 26 in a common sidewall 22 or in separate sidewalls 22. In any case, fluid circuit 28 can be tailored such that primary channel 30 fluidly connects all fluid inlets 24 and all fluid outlets 26.

Figure 4:
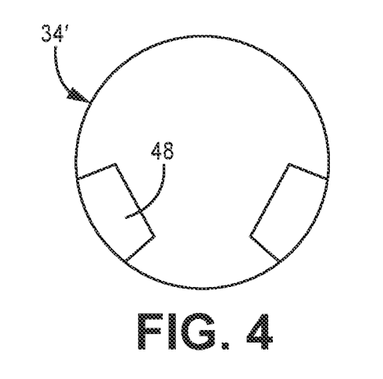
FIG. 4 is a simplified cross-sectional view of an alternative embodiment of a tertiary channel of the fluid circuit.
Figure 5:
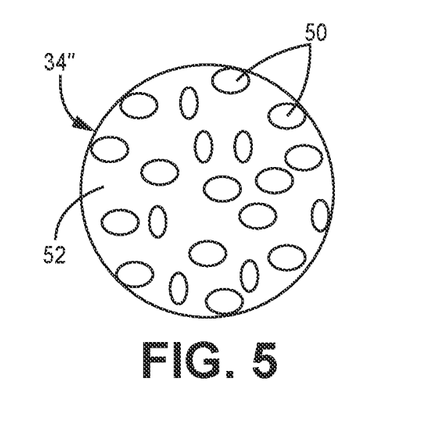
FIG. 5 is a simplified cross-sectional view of a second alternative embodiment of a tertiary channel of the fluid circuit.
Figure 6:
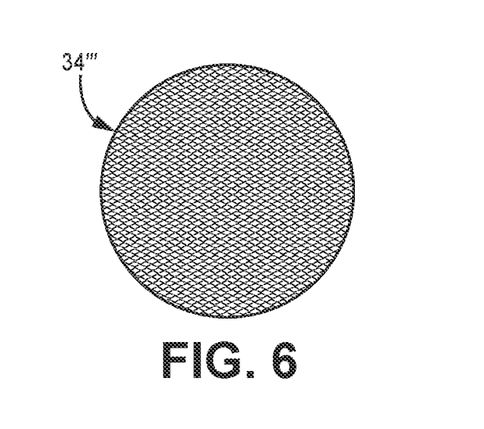
FIG. 6 is a simplified cross-sectional view of a third alternative embodiment of a tertiary channel of the fluid circuit.

In addition to complex channel shapes and branching patterns, individual channels can include features within an interior portion (i.e., fluid handling portion) of the channel. FIG. 3 is a simplified cross-sectional view of a tertiary channel 34, shown as an open channel (i.e., nothing formed in the interior space). FIGS. 4, 5, and 6 are simplified cross-sectional views of alternative tertiary channels 34',34", and 34''', respectively, each having internal features.

As shown in FIG. 3, tertiary channel 34 has a cross-sectional area defined by its radius r. Although shown as a generally circular cross-section, it should be understood that tertiary channel 34 can have other types of symmetrical or irregular geometries, as was previously discussed. In the embodiment of FIG. 4, tertiary channel 34' includes internal fins 48. Fins 48 can be uniformly or non-uniformly distributed in tertiary channel 32A based on, for example, desired fluid flow characteristics (e.g., direction, velocity, etc.). Although shown with relatively straight edges, fins 48 can have various geometries. As such, fins 48 can be formed by additive manufacturing to achieve the desired distribution and geometries. FIG. 5 shows another alternative embodiment in which tertiary channel 34" includes pores 50 within a solid matrix material 52. Solid matrix material 52 can be equivalent to the solid material forming center wall 38, as tertiary channel 34" can be disposed within center wall 38 like tertiary channels 34 of FIG. 2. Tertiary channel 34" can be formed, for example, by additively manufacturing center wall 38 in select locations such that the build material is less densely packed as compared to more densely packed (solid) regions of center wall 38 to form a porous channel 34" with pores 50 for permitting an amount of cooling fluid F to pass through tertiary channel 34". Tertiary channel 34" may be desirable if, for example, where structural requirements favor more solid material and pores 50 are sufficient to meet fluid flow requirements. FIG. 6 shows tertiary channel 34''' with an internal lattice network. Such an embodiment may be desirable if, for example, for increased structural rigidity of the fluid circuit. It is further contemplated that an alternative embodiment can include one or a combination of tertiary channels 34, 34',34" and/or 34'''. In alternative embodiments the features of tertiary channels 34',34", and/or 34''' can be additionally or alternatively included within primary channel 30 and/or secondary channels 32.

In an exemplary embodiment, cold plate 12 can be formed partially or entirely by additive manufacturing to achieve the complex geometries within fluid circuit 28. For metal components (e.g., Inconel, aluminum, titanium, etc.) exemplary additive manufacturing processes include powder bed fusion techniques such as direct metal laser sintering (DMLS), laser net shape manufacturing (LNSM), electron beam manufacturing (EBM), to name a few, non-limiting examples. For polymer or plastic components, stereolithography (SLA) can be used. For ceramic materials, binder jetting, photopolymerization, SLA, or a material deposition method can be used. Additive manufacturing is particularly useful in obtaining unique geometries such as the shape of walls 36 and 38, the branching pattern of fluid network 28, and/or the varied geometries of individual fluid channels. However, other suitable manufacturing process, such as brazing, can be used.

For powder-based additive manufacturing techniques, a pulverant/powder build material can be deposited on a build surface and solidified using an energy source. These general steps of powder deposition and solidification can be repeated as a three-dimensional structure (e.g., walls 36 and 38) is formed in a layer-by layer fashion. An amount of excess (loose) powder can remain within cold plate 12, especially within regions of cold plate 12 that remain open (e.g., fluid channels). The tortuous design of fluid circuit 28 can make removal of excess powder challenging once cold plate 12 is fully assembled with outer casing 16.

Figure 7:
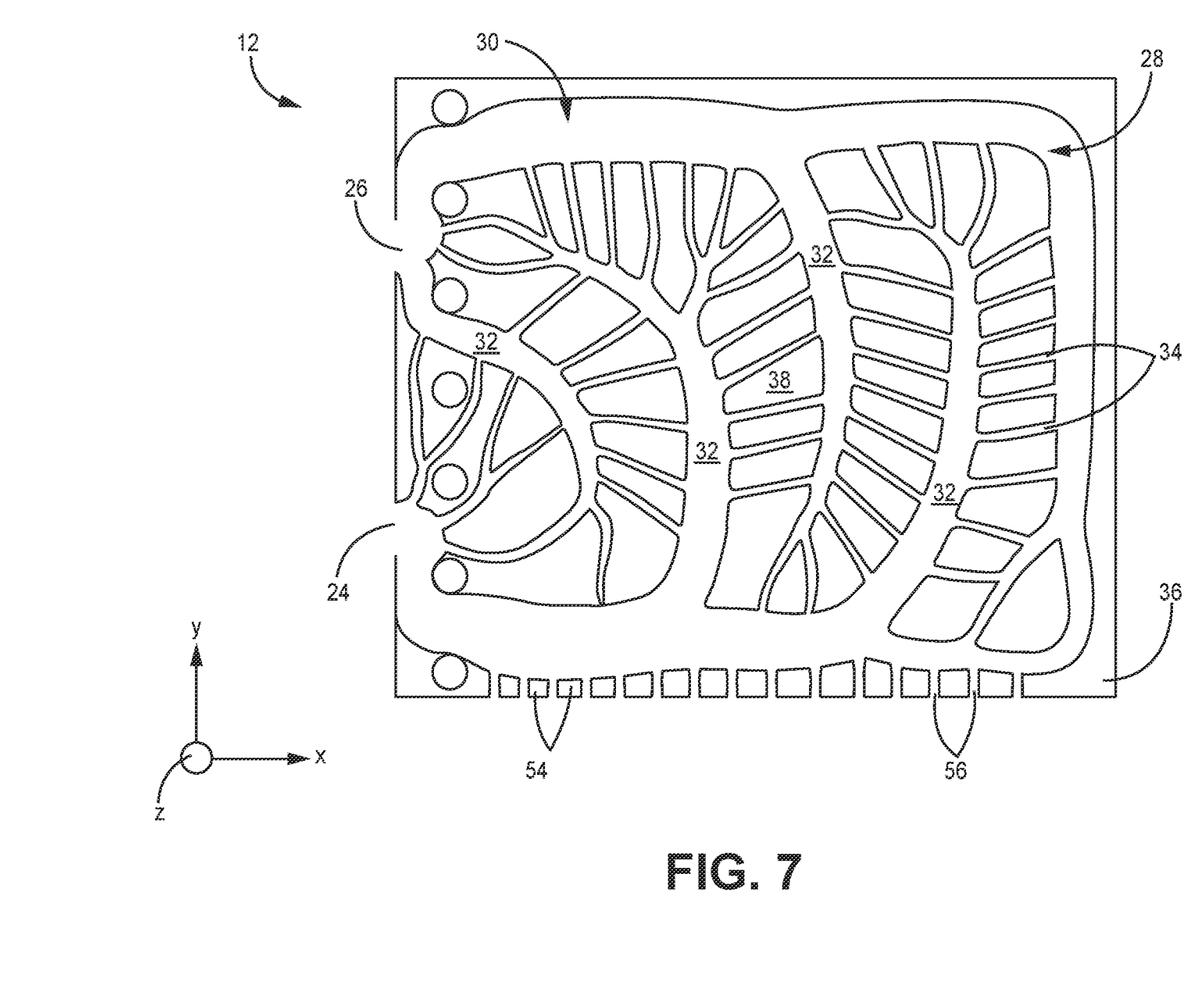
FIG. 7 is a top plan view of an intermediate cold plate assembly with the cover plate removed to illustrate a feature to facilitate excess powder removal.

FIG. 7 is a top plan view of the cold plate assembly in an intermediate manufacture state, shown without cover plate 18. As shown in FIG. 7, center wall 38 has been formed with tertiary channels 34. Three sides of peripheral wall 36 have also been formed. One longitudinally extending side (extending along the x-axis) of peripheral wall 36 has been partially formed. More specifically, a section of peripheral wall 36 includes fins 54 which are spaced apart to define apertures 56. Fins 54 can be formed from the same material as the remainder of wall 36. Excess powder is removed or exhausted through apertures 56 from the internal space of cold plate 12 after fluid circuit 28 and outer housing 16 is formed. One manner of removing excess powder can involve turning cold plate 12 such that fins 54 and apertures 56 are facing downward (along the z-axis). In this orientation, some excess powder may be drawn out through apertures 56 by gravity. Shaking or vibrating cold plate 12 while oriented in this manner can further facilitate excess powder removal. Additionally and/or alternatively, an air stream or vacuum can be applied to one or more apertures 56 to remove excess powder. In alternative embodiments, additional portions of peripheral wall 36 can be formed with fins 54 and apertures 56, depending on, for example, the complexity of the design of fluid circuit 28 or the anticipated amount of excess powder from a particular additive manufacturing technique. Alternatively, and for these same reasons, only a discrete segment of wall 36 may be formed to include fewer fins 54 and apertures 56 than are illustrated in FIG. 7. After sufficient removal of excess powder, the section of wall 36 having fins 54 and apertures 56 can be subjected to one or more post-processing steps to fluidly seal cold plate 12 (except for fluid inlet and 24 and fluid outlet 26). Such steps can include a material joining technique (e.g., welding or brazing) to join one or more solid pieces of material to wall 36 to cover apertures 56. In an alternative embodiment, the longitudinally extending side of wall 36 can be formed as a porous material with pores sized to allow for excess powder to be evacuated. Post-processing to seal the porous material could involve material joining, as discussed above, or further round of additive manufacturing to form dense, fluidly-sealed layers over the porous material. It is further possible in either a finned or porous embodiment to seal the wall segment using a resin (e.g., epoxy) material to plug apertures 56.

Figure 8:
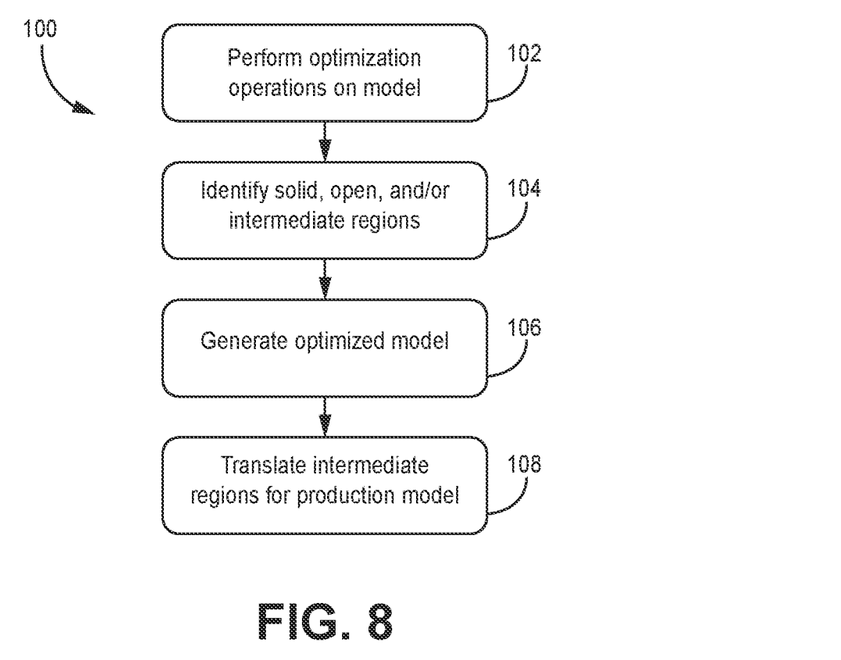
FIG. 8 is a flow chart illustrating steps of a method of designing and optimizing the fluid circuit of the cold plate.

FIG. 8 is a method flow chart illustrating select steps of method 100 for designing fluid circuit 28 of cold plate 12. At step 102, optimization operations are performed on a proposed three-dimensional model of a fluid circuit. These operations can be based on various input parameters such as weight and dimensional limits, required mechanical properties, fluid inlet and outlet locations, thermal transfer requirements, and fluid flow requirements, to name a few, non-limiting examples. At step 104, the optimizer identifies solid, open, and intermediate regions of the fluid circuit. Solid regions (e.g., wall 36) can be assigned a numerical value at or near 1.0, while open regions (e.g., primary channel 30) can be assigned a value at or near 0. Intermediate regions can be assigned values between 0 and 1.0. At step 106, an optimized model including all/any of solid, open, and intermediate regions is generated. Step 108 is a translation step in which the intermediate regions of the optimized model are interpreted for a subsequent production model (e.g., CAD model) as partially-open structures. For example, tertiary channels 34 may be included in the optimized model, and may further be designated as intermediate regions. Accordingly, tertiary channels 34 can be designed to include densely packed fins, similar to tertiary channel 34' of FIG. 4. Tertiary channels 34 can alternatively and/or additionally be designed as porous channels or lattice structures similar to tertiary channels 34'' and 34''', respectively. Such interpretations are suitable for subsequent additive manufacturing processes which are capable of producing such structures.

The methods discussed herein allow for the optimal design of cold plate 12 which can require complex fluid circuit geometries and varied material densities, as well as the ability to manufacture such designs and sufficiently remove waste materials.

Discussion of Possible Embodiments

The following are non-exclusive descriptions of possible embodiments of the present invention.

A method of manufacturing a cold plate includes forming a fluid circuit on a build surface in a layer-by-layer fashion from a build material. The fluid circuit includes a plurality of peripheral walls, each of the plurality of peripheral walls at least partially defining a primary channel, a longitudinally one of the peripheral walls being formed to include apertures configured to permit excess build material to pass therethrough. A central wall of the fluid circuit at least partially defines the primary channel and a plurality of secondary channels fluidly connected to the primary channel. The method further includes removing excess build material through the apertures.

The method of the preceding paragraph can optionally include, additionally and/or alternatively, any one or more of the following features, configurations and/or additional components:

In the above method, the longitudinally extending one of the peripheral walls can be formed from one of a porous material and a plurality of fins.

In any of the above methods, the build material can be a powder.

In any of the above methods, the fluid circuit can be formed using a powder-based additive manufacturing technique.

Any of the above methods can further include forming an outer cover on the cold plate.

In any of the above methods, removing the excess build material comprises exhausting the excess build material through the first of the plurality of peripheral walls using a shaking, vibrating, or vacuum technique.

Any of the above methods can further include sealing the first of the plurality of peripheral walls after removing the excess build materials.

In any of the above methods, sealing the first of the peripheral walls can include attaching a solid material to the first of the peripheral walls using a welding or brazing technique.

In any of the above methods, the first of the plurality of walls can abut a second of the plurality of walls, and the second of the plurality of walls can include one of a fluid inlet and a fluid outlet.

Any of the above methods can further include forming the central wall with a plurality of tertiary channels extending therethrough.

In any of the above methods, a first of the plurality of tertiary channels can fluidly connect a first of the plurality of secondary channels and the primary channel.

In any of the above methods, a second of the plurality of tertiary channels can fluidly connect the first of the plurality of secondary channels and a second of the plurality of secondary channels.

In any of the above methods, at least one of the plurality of tertiary channels can include fins.

In any of the above methods, at least one of the plurality of tertiary channels can include one of a porous material and a lattice structure configured to permit an amount of fluid to flow therethrough.

A method of designing a fluid circuit for a cold plate includes performing operations on a three-dimensional model of the cold plate based upon input parameters, the optimization operations including identifying solid regions of the fluid circuit with a first numeric value, identifying open regions of the fluid circuit with a second numeric value, and identifying intermediate regions of the fluid circuit with at least one numeric value between the first and second numeric value. The method further includes generating an optimized model and translating the optimized model such that the intermediate regions represent partially-open regions.

The method of the preceding paragraph can optionally include, additionally and/or alternatively, any one or more of the following features, configurations and/or additional components:

The above method can further include additively manufacturing the fluid circuit based on the optimized model.

In any of the above methods, the solid regions can be formed as one of a plurality of peripheral walls and a central wall.

In any of the above methods, the open regions can be one of a primary channel and a plurality of secondary channels.

In any of the above methods, the partially-open regions can be formed as a plurality of tertiary channels with fins.

In any of the above methods, the partially-open regions can be formed as tertiary channels comprising a porous material configured to permit an amount of a fluid to flow therethrough.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of manufacturing a cold plate, the method comprising:
   forming a fluid circuit on a build surface in a layer-by-layer fashion from a powderized build material, the fluid circuit comprising:
      a plurality of peripheral walls;
         wherein each of the plurality of peripheral walls at least partially defines a primary channel; and wherein a longitudinally extending one of the peripheral walls is formed to include apertures configured to permit excess build material to pass therethrough, the longitudinally extending one of the peripheral walls being formed from one of a porous material and a plurality of fins; and a central wall at least partially defining the primary channel and a plurality of secondary channels fluidly connected to the primary channel;

removing excess build material through the apertures by exhausting the excess build material through the first of the plurality of peripheral walls using a shaking, vibrating, or vacuum technique;

forming a cover on the cold plate; and sealing the first of the plurality of peripheral walls after removing the excess build material.

2. The method of claim 1, wherein the fluid circuit is formed using a powder-based additive manufacturing technique.

3. The method of claim 1, wherein sealing the first of the peripheral walls comprises attaching a solid material to the first of the peripheral walls using a welding or brazing technique.

4. The method of claim 3, wherein the first of the plurality of walls abuts a second of the plurality of walls, the second of the plurality of walls comprising one of a fluid inlet and a fluid outlet.

5. The method of claim 1 and further comprising:
forming the central wall with a plurality of tertiary channels extending therethrough.

6. The method of claim 5, wherein a first of the plurality of tertiary channels fluidly connects a first of the plurality of secondary channels and the primary channel.

7. The method of claim 6, wherein a second of the plurality of tertiary channels fluidly connects the first of the plurality of secondary channels and a second of the plurality of secondary channels.

8. The assembly of claim 5, wherein at least one of the plurality of tertiary channels comprises fins.

9. The assembly of claim 5, wherein at least one of the plurality of tertiary channels comprises one of a porous material and a lattice structure configured to permit an amount of fluid to flow therethrough.

10. A method of designing a fluid circuit for a cold plate, the method comprising:
performing optimization operations on a three-dimensional model of the cold plate based upon input parameters, the optimization operations comprising;
identifying solid regions of the fluid circuit with a first numeric value;
identifying open regions of the fluid circuit with a second numeric value; and
identifying intermediate regions of the fluid circuit with at least one numeric value between the first and second numeric value;
generating an optimized model; and
translating the optimized model such that the intermediate regions represent partially-open regions.

11. The method of claim 10 and further comprising:
additively manufacturing the fluid circuit based on the optimized model.

12. The method of claim 11, wherein the solid regions are formed as one of a plurality of peripheral walls and a central wall.

13. The method of claim 12, wherein the open regions are one of a primary channel and a plurality of secondary channels.

14. The method of claim 13, wherein the partially-open regions are formed as a plurality of tertiary channels with fins.

15. The method of claim 13, wherein the partially-open regions are formed as tertiary channels comprising a porous material configured to permit an amount of a fluid to flow therethrough.

* * * * *